United States Patent
Loftus (10) Patent No.: US 10,882,403 B2
(45) Date of Patent: Jan. 5, 2021

(54) VEHICLE HIGH/LOW VOLTAGE SYSTEMS ISOLATION TESTING

(71) Applicant: Ford Global Technologies, LLC

(72) Inventor: Michael Edward Loftus, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 1899 days.

(21) Appl. No.: 14/264,342

(22) Filed: Apr. 29, 2014

(65) Prior Publication Data

US 2015/0061688 A1 Mar. 5, 2015

Related U.S. Application Data (60) Provisional application No. 61/872,709, filed on Aug. 31, 2013.

(51) Int. Cl.
*G01R 31/00* (2006.01)
*B60L 3/00* (2019.01)
(Continued)

(52) U.S. Cl.
CPC .......... *B60L 3/0069* (2013.01); *B60L 50/16* (2019.02); *B60L 58/20* (2019.02); *G01R 31/50* (2020.01);
(Continued)

(58) Field of Classification Search
CPC ...... G01R 31/025; G01R 31/02; G01R 31/40; G01R 27/18; G01R 31/006; B60L 11/1864; B60L 3/0046; B60L 3/0069
See application file for complete search history.

(56) References Cited

U.S. PATENT DOCUMENTS 5,416,416 A * 5/1995 Bisher .................. G01R 31/40
324/426
5,446,682 A 8/1995 Janke et al.
(Continued)

FOREIGN PATENT DOCUMENTS

CN 101442211 A 5/2009
EP 0752107 A1 1/1997
(Continued)

OTHER PUBLICATIONS

Analog Devices, Analog Dialogue, vol. 43, No. 4, 2009, A forum for the exchange of circuits, systems, and software for real-world signal processing, www.analog.com/analogdialogue.
(Continued)

*Primary Examiner* — Son T Le
*Assistant Examiner* — Adam S Clarke
(74) *Attorney, Agent, or Firm* — David B. Kelley; Brooks Kushman P.C.

(57) ABSTRACT

Systems or methods for testing performance of an isolation monitor for a vehicle having a high voltage traction battery electrical system isolated from a low voltage electrical system include a device for connecting to an isolation/leakage monitor under test. The device includes a current leakage bus, a current leakage array, and a current leakage destination with associated switching elements automatically controlled by a programmed microprocessor to introduce various leakage impedances to a second voltage source or ground and to evaluate performance of the isolation/leakage monitor under test.

19 Claims, 4 Drawing Sheets

(51) Int. Cl.
  *G01R 35/00* (2006.01)
  *B60L 58/20* (2019.01)
  *B60L 50/16* (2019.01)
  *G01R 31/50* (2020.01)

(52) U.S. Cl.
  CPC ........ *G01R 35/00* (2013.01); *B60L 2240/545* (2013.01); *B60L 2240/547* (2013.01); *B60L 2240/549* (2013.01); *G01R 31/006* (2013.01); *Y02T 10/70* (2013.01); *Y02T 10/7072* (2013.01)

(56) References Cited

U.S. PATENT DOCUMENTS

| | | | |
|---|---|---|---|
| 7,026,788 B2 | 4/2006 | Yano et al. | |
| 7,592,815 B2 | 9/2009 | Yano | |
| 7,852,089 B2 | 12/2010 | Acena et al. | |
| 8,283,929 B2 | 10/2012 | Wang | |
| 8,554,500 B2 | 10/2013 | Schumacher | |
| 2006/0055246 A1* | 3/2006 | Jansen | B60L 3/0023 307/87 |
| 2007/0285057 A1 | 12/2007 | Yano | |
| 2009/0147414 A1* | 6/2009 | Lazarovich | G01R 31/025 361/42 |
| 2010/0259276 A1* | 10/2010 | Streit | G01R 31/362 324/525 |
| 2011/0049977 A1 | 3/2011 | Onnerud et al. | |
| 2011/0218745 A1 | 9/2011 | Hasan et al. | |
| 2011/0298469 A1* | 12/2011 | Astrom | G01R 27/18 324/509 |
| 2011/0304339 A1 | 12/2011 | Schumacher et al. | |
| 2011/0307196 A1* | 12/2011 | Schumacher | G01R 31/025 702/58 |
| 2012/0206148 A1* | 8/2012 | Schaefer | G01R 27/18 324/509 |
| 2013/0151175 A1* | 6/2013 | Streit | G01R 31/025 702/58 |
| 2013/0154656 A1 | 6/2013 | Tabatowski-Bush | |
| 2013/0278272 A1 | 10/2013 | Kaminski | |
| 2013/0300430 A1* | 11/2013 | Lindsay | B60L 3/0046 324/522 |
| 2014/0358462 A1* | 12/2014 | Christophersen | G01R 31/389 702/65 |
| 2017/0131340 A1* | 5/2017 | Tallam | B60L 3/0069 |

FOREIGN PATENT DOCUMENTS

| | | |
|---|---|---|
| EP | 0752109 A1 | 1/1997 |
| EP | 0776479 B1 | 10/2002 |
| EP | 1061374 B1 | 4/2006 |
| EP | 1872119 A2 | 1/2008 |
| JP | 2007149561 A | 6/2007 |
| WO | 2006108081 A2 | 10/2006 |
| WO | 2010029353 A1 | 3/2010 |
| WO | 2011094304 A2 | 8/2011 |
| WO | 2013111414 A1 | 8/2013 |

OTHER PUBLICATIONS

David Skalny, et al., Battery Management System (BMS) Evaluation Toolset Final Report, Aug. 16, 2011.
Chinese Patent Office, First Office Action for the corresponding Chinese Patent Application No. 201410433280.5, dated Jan. 19, 2018.
Notice of Allowance dated Jan. 14, 2020, for related U.S. Appl. No. 14/688,658; 13 Pages.

* cited by examiner

VEHICLE HIGH/LOW VOLTAGE SYSTEMS ISOLATION TESTING

CROSS-REFERENCE TO RELATED APPLICATIONS

This application claims the benefit of U.S. provisional application Ser. No. 61/872,709 filed Aug. 31, 2013, the disclosure of which is hereby incorporated in its entirety by reference herein.

TECHNICAL FIELD

This application relates to testing performance of hybrid and electric vehicle electrical system components relative to isolation between high and low voltage electrical systems.

BACKGROUND

A high-voltage traction battery may be used for hybrid and electric vehicle applications. Vehicles having a traction battery may include a battery management system (BMS) having a battery electronic control module (BECM) that monitors isolation between the high voltage system and the low voltage system of the vehicle. The BECM may provide a diagnostic indicator and/or shut down various systems or subsystems if the isolation between the high and low voltages systems is compromised due to a component failure to limit exposure to high voltage by other vehicle components, occupants, or service technicians, for example.

It is advantageous to evaluate the performance of the isolation monitor feature as early as possible in the development cycle of the BECM hardware and software. However, a suitable testing environment may not be available until prototype traction battery packs or prototype vehicles are available, which may be too late in the development cycle to avoid significant costs and delays to correct. In addition, hardware or software changes during vehicle development may impact isolation monitoring and immediate validation and testing can be difficult to manage at the battery pack and vehicle levels with limited resource availability.

SUMMARY

Various embodiments of the present disclosure include systems or methods for testing performance of an isolation monitor for a vehicle having a high voltage traction battery electrical system isolated from a low voltage electrical system. The systems or methods include a device for connecting to an isolation/leakage monitor under test. The device includes a current leakage bus, a current leakage array, and a current leakage destination with associated switching elements automatically controlled by a programmed microprocessor to introduce various leakage impedances to a second voltage source or ground and to evaluate performance of the isolation/leakage monitor under test. The isolation/leakage monitor may be implemented by software executed by a second microprocessor, such as a battery electronic control module (BECM), and related circuitry, for example. The programmed microprocessor executes a testing protocol to operate a switch to selectively connect a cell within a high-voltage cell array to the leakage bus. The leakage array may include a plurality of switches to selectively introduce a variable impedance into the leakage path. In one embodiment, the leakage array includes a plurality of parallel resistors and capacitors. One or more switches of the leakage array are activated via microprocessor control to select the desired amount of real or complex impedance. The microprocessor also activates a destination switch to complete the leakage path to a second voltage source or ground, typically either a 12V source or ground to simulate a vehicle low-voltage system or chassis, respectively.

In various embodiments, the microprocessor provides an external communication interface, such as an Ethernet or controller area network (CAN) interface, to allow external control of the system and to provide status and feedback to external controls and systems.

Embodiments of an isolation monitor evaluation tool according to the present disclosure have various associated advantages. For example, an isolation monitor evaluation tool according to various embodiments can be integrated into existing battery simulator devices, allows introduction of variable leakage to a high voltage system without manual contact of components at high voltage potentials, and allows the introduction of complex impedances to a high voltage system. Other advantages of an isolation monitor evaluation tool according to embodiments of the disclosure include providing automated control of leakage source, variable real or complex impedance, and a selectable destination or sink. Use of an isolation monitor performance tool according to the disclosure provides isolation monitor testing of a battery electronic control module and associated circuitry without a traction battery pack or vehicle to facilitate testing of the feature earlier in the development cycle. In addition, various embodiments allow the automated introduction of leakage at any point along the cell string.

An isolation monitor performance tool includes at least one impedance, at least one leakage destination and a plurality of switches associated with the at least one impedance, the at least one leakage destination, and a plurality of terminals of a battery cell string. The isolation monitor performance tool also includes at least one controller programmed to operate the switches to selectively connect a leakage destination through a selected impedance to a selected terminal to create a leakage path. The at least one impedance may include a resistor. The at least one impedance may include a capacitor. The at least one controller may be further programmed to select one leakage destination and one terminal. The at least one leakage destination may include a low voltage source and ground. The at least one controller may be further programmed to communicate with an isolation monitor to receive a diagnostic code from the isolation monitor. The at least one controller may be further programmed to apply various combinations of the switches, compare a response from the isolation monitor to an expected response, and output an isolation monitor test status based on the response and the expected response.

A method of testing an isolation monitor includes activating, by a controller, a combination of switching elements to connect at least one impedance between a selected leakage destination and a selected terminal of a battery cell string. The method further includes receiving, from the isolation monitor, a diagnostic code indicative of isolation detection. The method further includes outputting a status based on a comparison of the diagnostic code to an expected response of the isolation monitor to the combination. The combination of switching elements may connect one terminal of the battery cell string. The combination of switching elements may connect one leakage destination. The at least one impedance may include a resistor. The at least one impedance may include a capacitor.

A battery simulator includes a plurality of voltage sources having at least one terminal, at least one impedance, at least one leakage destination, and a plurality of switches associated with the at least one impedance, the at least one leakage destination, and the terminals. The battery simulator further includes at least one controller programmed to operate the plurality of switches to selectively connect a leakage destination through a selected impedance to a selected terminal to create a leakage path. The at least one impedance may include a resistor. The at least one impedance may include a capacitor. The at least one leakage destination may include a ground connection and a low voltage source. The at least one controller may be further programmed to communicate with an isolation monitor to receive a diagnostic code from the isolation monitor. The at least one controller may be further programmed to output a status based on the diagnostic code and an expected response of the isolation monitor to the leakage path. The voltage sources may be connected in series. The at least one impedance may be a plurality of impedances, and the selected impedance may be a combination of more than one of the plurality of impedances.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
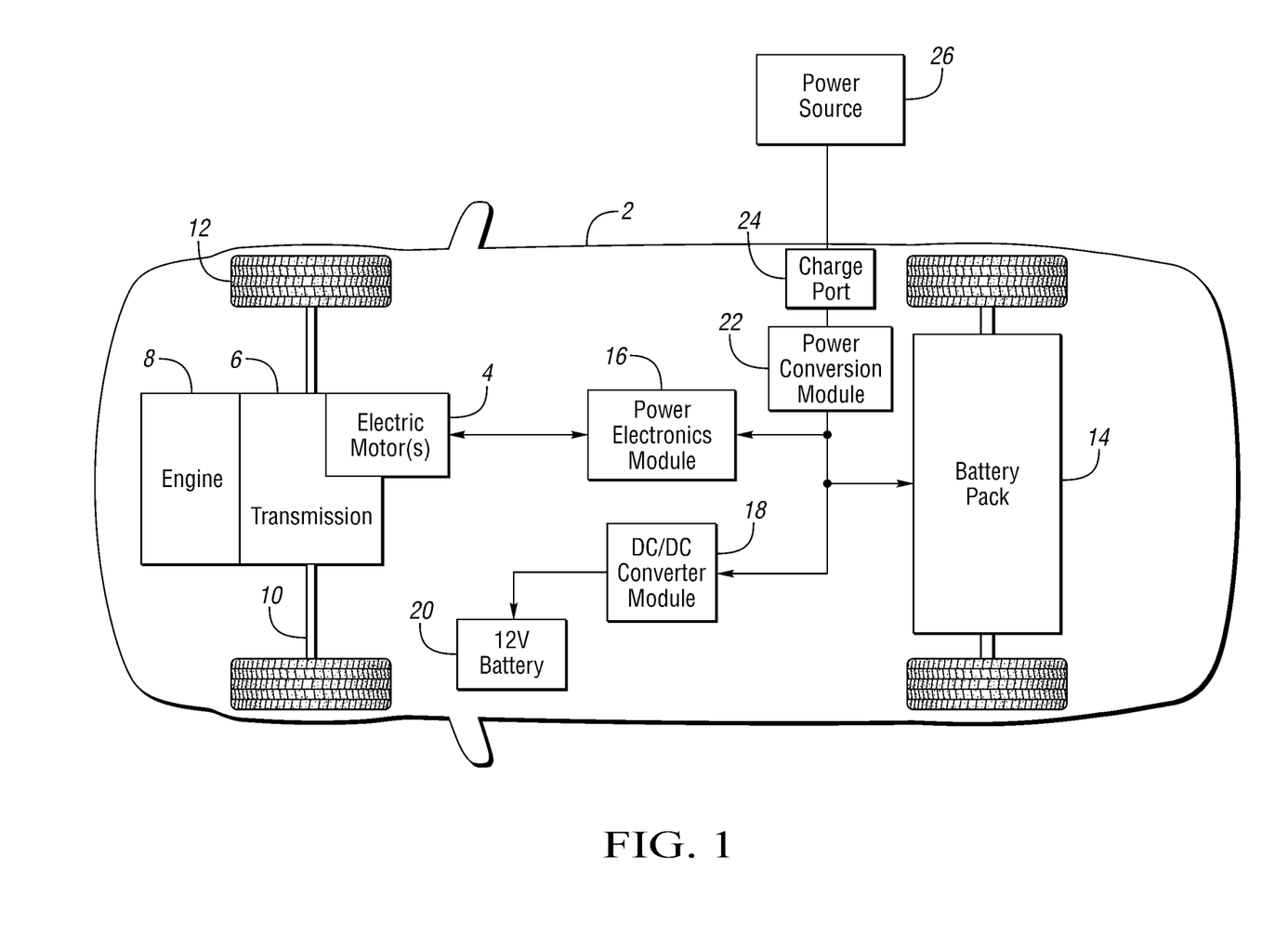
FIG. 1 is a diagram of a representative vehicle having a traction battery and associated controller with an isolation monitor to monitor isolation between a high voltage and low voltage electrical system according to various embodiments of the disclosure.

FIG. 1 depicts a representative vehicle having a traction battery. While the representative embodiment illustrated depicts a plug-in hybrid-electric vehicle, those of ordinary skill in the art will recognize that various embodiments may be utilized with other types of electric and hybrid vehicles having a traction battery. For example, the systems and methods described herein are equally applicable to an electric vehicle without an internal combustion engine or any other device using a traction battery or battery pack and associated high voltage electrical system electrically isolated from a low voltage electrical system, typically 12V or 24V.

A typical plug-in hybrid-electric vehicle 2 may comprise one or more electric machines operable as motors 4 mechanically connected to a hybrid transmission 6. In addition, the hybrid transmission 6 is mechanically connected to an engine 8. The hybrid transmission 6 may also be mechanically connected to a drive shaft 10 that is mechanically connected to the wheels 12. The electric motors 4 can provide propulsion and deceleration capability when the engine 8 is turned on or off. The electric motors 4 may also act as generators and can provide fuel economy benefits by recovering energy that would normally be lost as heat in the friction braking system. The electric motors 4 may also reduce pollutant emissions since the hybrid electric vehicle 2 may be operated in electric mode under certain conditions.

The traction battery pack 14 stores energy that can be used by the electric motors 4. A vehicle battery pack 14 typically provides a high voltage DC output. The battery pack or traction battery 14 is electrically connected to a power electronics module 16. The power electronics module 16 is also electrically connected to the electric motors 4 and provides the ability to bi-directionally transfer energy between the battery pack 14 and the electric motors 4. For example, a typical traction battery 14 may provide a DC voltage while the electric motors 4 may require a three-phase AC current to function. The power electronics module 16 may convert the DC voltage to a three-phase AC current as required by the electric motors 4. In a regenerative mode, the power electronics module 16 will convert the three-phase AC current from the electric motors 4 acting as generators to the DC voltage required by the battery pack 14.

In addition to providing energy for propulsion, the battery pack 14 may provide energy for other vehicle electrical systems. A typical system may include a DC/DC converter module 18 that converts the high voltage DC output of the battery pack 14 to a low voltage DC supply that is compatible with other vehicle loads. Other high voltage loads, such as compressors and electric heaters, may be connected directly to the high-voltage bus from the battery pack 14. In a typical vehicle, the low voltage systems are electrically connected to a 12V battery 20 and are electrically isolated from the high voltage electrical system. An all-electric vehicle may have a similar architecture but without the engine 8.

The battery pack 14 may be recharged by an external power source 26. The external power source 26 may provide AC or DC power to the vehicle 2 by electrically connecting through a charge port 24. The charge port 24 may be any type of port configured to transfer power from the external power source 26 to the vehicle 2. The charge port 24 may be electrically connected to a power conversion module 22. The power conversion module may condition the power from the external power source 26 to provide the proper voltage and current levels to the battery pack 14. In some applications, the external power source 26 may be configured to provide the proper voltage and current levels to the battery pack 14 and the power conversion module 22 may not be necessary. The functions of the power conversion module 22 may reside in the external power source 26 in some applications.

Figure 2:
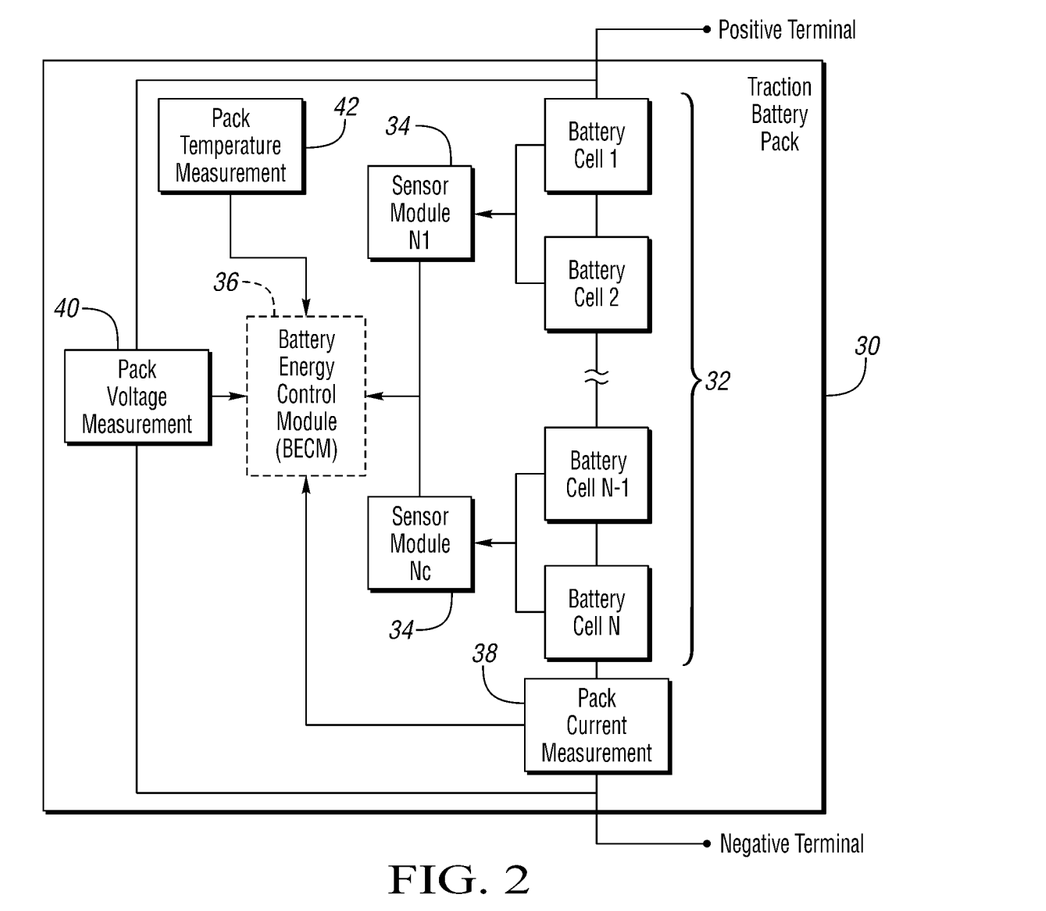
FIG. 2 is a diagram of a representative traction battery pack including a controller and circuitry for monitoring isolation.

Battery packs may be constructed from a variety of chemical formulations. Typical battery pack chemistries are lead acid, nickel-metal hydride (NIMH) or Lithium-Ion. FIG. 2 shows a typical battery pack 30 in a simple series configuration of N battery cells 32. Other battery packs, however, may be composed of any number of individual battery cells connected in series or parallel or some combination thereof. A typical system may have one or more controllers, such as a Battery Energy Control Module (BECM) 36, that monitor and control the performance of the battery pack 30. The BECM 36 may monitor several battery pack level characteristics such as pack current 38, pack voltage 42 and pack temperature 40. The BECM 36 may have non-volatile memory such that data may be retained when the BECM is in an off condition. Retained data may be available upon the next key cycle.

The BECM 36 may include hardware and/or software to perform an isolation monitor function. The isolation monitor function monitors electrical isolation of the high voltage electrical system from the low voltage electrical system of the vehicle by detecting leakage currents. Upon detection of a leakage current that exceeds a predetermined level, the isolation monitor may set a diagnostic code and/or perform various control functions to shut down or disable one or more vehicle systems or subsystems to reduce or prevent continued exposure of vehicle components, service technicians, or occupants to high voltage. An isolation monitor performance tool according to embodiments of the present disclosure may be used to evaluate the BECM 36 hardware and associated software outside of the vehicle such that an actual vehicle or traction battery pack is not needed.

In addition to the battery pack level characteristics, there may be battery cell level characteristics that are measured and monitored by the BECM 36 and proper operation evaluated by an isolation monitor tool according to embodiments of the present disclosure. For example, the terminal voltage, current, and temperature of each cell may be measured. A battery controller 36 may include voltage monitoring circuits 34 to measure the voltage across the terminals of each of the N cells 32 of the battery pack 30. The voltage monitoring circuits 34 may be a network of resistors and capacitors configured to provide proper scaling and filtering of the cell voltage signals. The voltage monitoring circuits 34 may also include other components for properly sampling the cell voltages and converting the voltages to digital values for use in a microprocessor. The voltage monitoring circuits 34 may also provide isolation so that high-voltages will not damage other circuitry with the BECM 36. An isolation monitor performance tool according to embodiments of the present disclosure may be used to evaluate operation of these components and circuitry, as well as the ability of the BECM isolation monitor software to detect leakage current through one or more of these components and circuitry.

Figure 3:
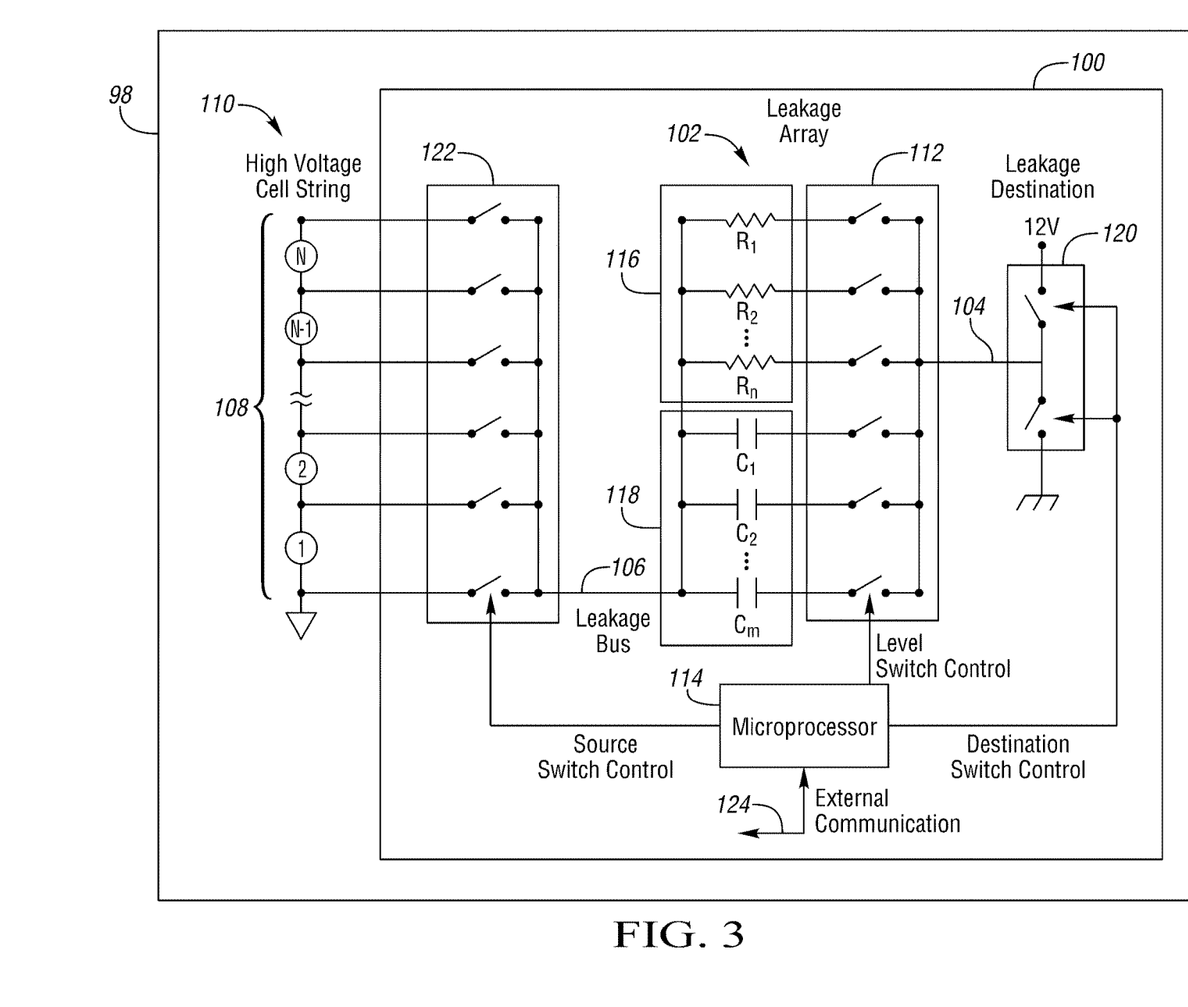
FIG. 3 is a diagram illustrating a representative embodiment of an isolation monitor testing device having a leakage bus connecting a high voltage cell string to a leakage array and leakage destination or sink.

As generally illustrated in the representative embodiment of FIG. 3, an isolation monitor performance tool 100 may include a leakage bus 106, a leakage array 102, and a leakage destination 104. In one embodiment, the leakage destination 104 is integrated or incorporated into a battery simulator 98 hardware interface layer. During operation, a terminal of a cell 108 within the high-voltage cell string 110, which simulates a multiple cell high voltage vehicle traction battery, is selectively connected to the leakage 106 bus via one or more associated source switches 122 under control from the microprocessor 114. The leakage array 102 is composed of a number of components 116, 118 to provide a desired real or complex impedance. In the illustrated embodiment, an array of parallel resistors 116 and capacitors 118 each with different values of resistance and capacitance, respectively, are selectively switched by one or more level switches 112 via the microprocessor 114 to provide the desired real or complex impedance in the leakage circuit 106 or path. Other embodiments may also include inductive loads. The microprocessor 114 selectively activates a destination switch 120 to complete the leakage path or circuit. In the illustrated embodiment, one destination is a second voltage source representing a typical vehicle low voltage system, which may be 12V, for example. Another destination may be connected to ground to simulate a vehicle chassis. Other embodiments may include multiple destinations of varying voltage levels.

The isolation monitor performance tool 100 may include a harness for connecting to a battery controller. The voltage sources 108 within the battery simulator 98 may be connected to the battery controller in the same manner as actual cells within the traction battery pack. The high voltage cell string 110 may simulate the actual battery cells (FIG. 2, 32). To the battery controller, the high voltage cell string 110 may appear to be a normal battery pack when the switches are not activated. When different combinations of switches are activated, the battery controller may detect leakage current using an internal isolation monitor.

The microprocessor 114 may apply various combinations of switches to test the reaction of the isolation monitor under test. The microprocessor 114 may monitor the response of the isolation monitor under test over the external communication link 124. The isolation monitor under test may send one or more diagnostic codes indicative of isolation detection over the external communication link 124. The microprocessor 114 may correlate the diagnostic code to the switch settings to ascertain if the proper behavior was taken by the isolation monitor.

The switches may be implemented with a variety of components. The switches or switching elements may be implemented as relays. The microprocessor may energize a coil associated with the relay to move a contact. The switches may also be implemented as solid state devices, such as transistors. The microprocessor may have associated circuitry to drive a gate of a transistor device to activate the switching device.

Figure 4:
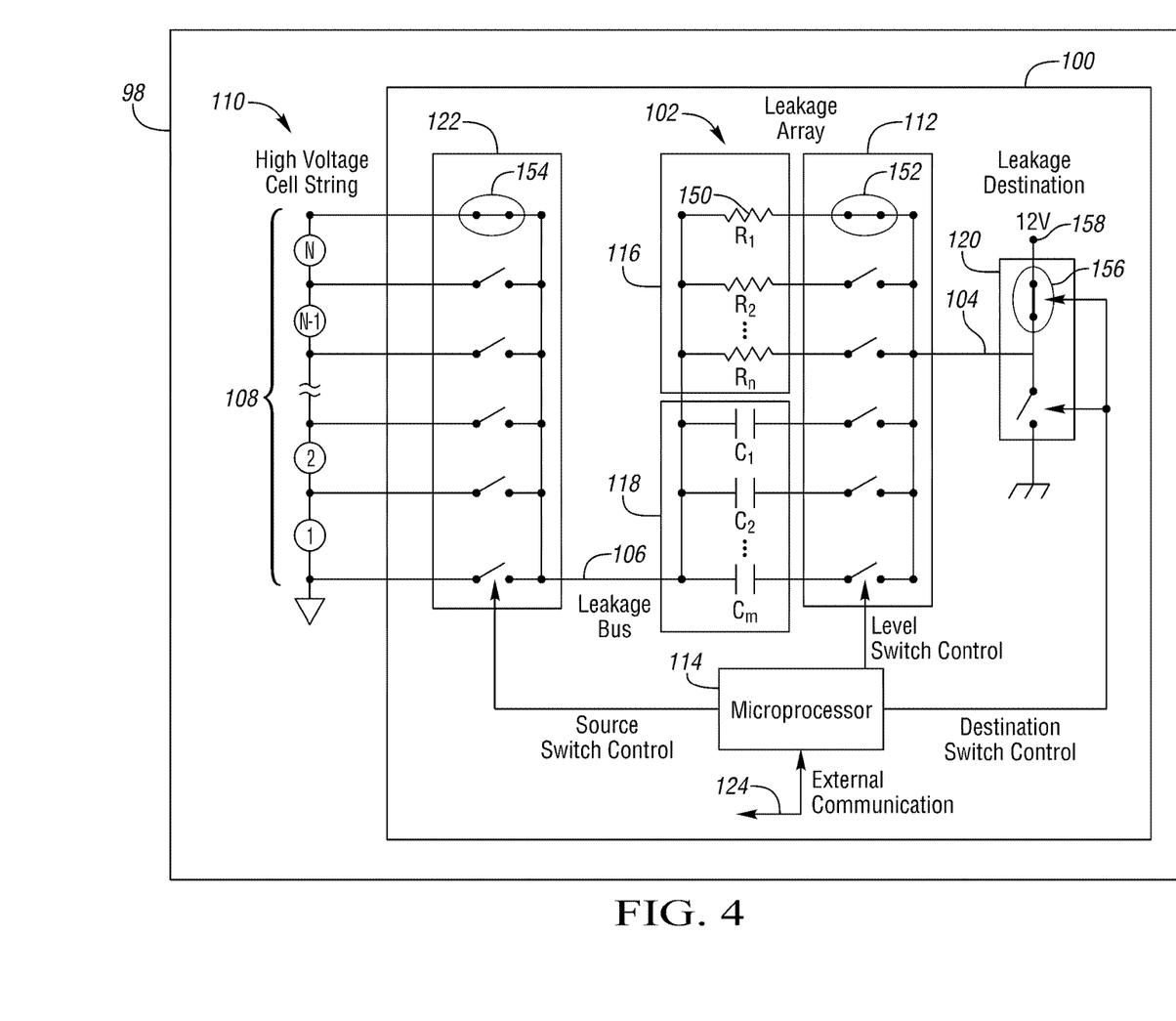
FIG. 4 is a diagram illustrating operation of a performance tool to evaluate an isolation monitor according to embodiments of the disclosure.

FIG. 4 illustrates the creation of a leakage path from the top of the high-voltage cell string 110, through a resistor R1 150, to the 12V supply 158 in the low-voltage domain. This is achieved by the microprocessor 114 closing the switches 152, 154, 156 identified with ellipses. The microprocessor 114 may also provide an external communication interface 124, such as Ethernet or CAN, to allow external control of the system and to provide status and feedback to external controls.

Referring again to FIG. 3, the strategy implemented in the microprocessor 114 may ensure that only one source switch 122 is closed at any time to protect against shorting cell outputs. The strategy may also ensure that only one destination switch 120 is closed at any time which, in the configuration shown in FIG. 3, prevents shorting the low voltage source of 12V directly to ground.

The isolation monitor performance tool 100 of the present disclosure may be used in a laboratory testing environment during all phases of battery system and vehicle development. The performance tool may also be employed by service technicians to test operation of a battery electronic control module (BECM) and associated circuitry during servicing of a vehicle.

Use of the isolation monitor performance tool 100 may provide useful information for battery controller design and implementation at an early stage of vehicle development when a prototype high voltage traction battery or other system components may not be available. An isolation monitor performance tool 100 of various embodiments can be integrated into existing battery simulator 98 devices, allows introduction of variable leakage to a high voltage system without manual contact of components at high voltage potentials, and allows the introduction of complex impedances to a high voltage system. Other advantages of an isolation monitor evaluation tool according to embodiments of the disclosure include providing automated control of leakage source, variable real or complex impedance, and a selectable destination or sink. In addition, various embodiments allow the automated introduction of leakage at any point along the cell string.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An isolation monitor performance tool comprising:
   at least one impedance;
   at least one leakage destination;
   a plurality of switches associated with each of the at least one impedance, the at least one leakage destination, and a plurality of terminals of a battery cell string; and
   a controller programmed to operate the plurality of switches to selectively connect a leakage destination through a selected impedance to a selected terminal to vary a leakage impedance detected by an isolation monitor.

2. The isolation monitor performance tool of claim 1 wherein the at least one impedance includes a resistor.

3. The isolation monitor performance tool of claim 1 wherein the at least one impedance includes a capacitor.

4. The isolation monitor performance tool of claim 1 wherein the controller is further programmed to select one of a plurality of leakage destinations and one of the plurality of terminals.

5. The isolation monitor performance tool of claim 1 wherein the at least one leakage destination includes a low voltage source and ground.

6. The isolation monitor performance tool of claim 1 wherein the controller is further programmed to communicate with the isolation monitor to receive a diagnostic code from the isolation monitor.

7. The isolation monitor performance tool of claim 6 wherein the controller is further programmed to apply various combinations of the switches, compare a response from the isolation monitor to an expected response, and output an isolation monitor test status based on the response and the expected response.

8. A method of testing an isolation monitor comprising:
   activating, by a controller, a combination of switching elements to connect at least one impedance between a selected one of a plurality of leakage destinations and a selected terminal of a battery cell string, wherein the combination causes a predetermined leakage current to be applied to the isolation monitor and for which there is associated an expected response of the isolation monitor;
   receiving, from the isolation monitor, a diagnostic code indicative of isolation detection; and
   outputting a status indicative of proper behavior responsive to the diagnostic code matching the expected response of the isolation monitor to the combination.

9. The method of claim 8 wherein the combination of switching elements connects a single terminal of the battery cell string.

10. The method of claim 8 wherein the combination of switching elements connects one of a plurality of leakage destinations.

11. The method of claim 8 wherein the at least one impedance includes a resistor.

12. The method of claim 8 wherein the at least one impedance includes a capacitor.

13. A battery simulator comprising:
   a plurality of voltage sources each having at least one terminal;
   a plurality of impedances;
   a plurality of leakage destinations;
   a plurality of switches associated with the plurality of impedances, the plurality of leakage destinations, and the terminals; and
   a controller programmed to operate the plurality of switches to selectively connect one of the plurality of leakage destinations through a selected impedance to a selected terminal to vary a leakage impedance detected by an isolation monitor.

14. The battery simulator of claim 13 wherein the plurality of impedances includes a resistor.

15. The battery simulator of claim 13 wherein the plurality of impedances includes a capacitor.

16. The battery simulator of claim 13 wherein the plurality of leakage destinations includes a ground connection and a low voltage source.

17. The battery simulator of claim 13 wherein the controller is further programmed to communicate with the isolation monitor to receive a diagnostic code from the isolation monitor.

18. The simulator of claim 17 wherein the controller is further programmed to output a status based on the diagnostic code and an expected response of the isolation monitor to the leakage impedance.

19. The battery simulator of claim 13 wherein the voltage sources are connected in series.

* * * * *